US011458798B2

(12) United States Patent
Lee et al.

(10) Patent No.: US 11,458,798 B2
(45) Date of Patent: Oct. 4, 2022

(54) THERMAL MANAGEMENT SYSTEM FOR VEHICLE

(71) Applicant: Hanon Systems, Daejeon (KR)

(72) Inventors: Jae Min Lee, Daejeon (KR); Young Chul Kim, Daejeon (KR); Seo Jun Yoon, Daejeon (KR); Seung Ho Lee, Daejeon (KR)

(73) Assignee: Hanon Systems, Daejeon (KR)

(*) Notice: Subject to any disclaimer, the term of this patent is extended or adjusted under 35 U.S.C. 154(b) by 20 days.

(21) Appl. No.: 17/041,580

(22) PCT Filed: May 3, 2019

(86) PCT No.: PCT/KR2019/005309
§ 371 (c)(1),
(2) Date: Sep. 25, 2020

(87) PCT Pub. No.: WO2019/212275
PCT Pub. Date: Nov. 7, 2019

(65) Prior Publication Data
US 2021/0016625 A1      Jan. 21, 2021

(30) Foreign Application Priority Data

May 4, 2018   (KR) .................. 10-2018-0051542

(51) Int. Cl.
*F25B 7/00*   (2006.01)
*B60H 1/00*   (2006.01)
*B60L 58/26*   (2019.01)

(52) U.S. Cl.
CPC .......... *B60H 1/00278* (2013.01); *B60L 58/26* (2019.02); *B60H 1/00885* (2013.01); (Continued)

(58) Field of Classification Search
CPC ............ B60H 1/00278; B60H 1/00885; B60H 1/00899; B60H 2001/00307; B60H 2001/00949; B60L 58/26; B60Y 2200/91
(Continued)

(56) References Cited

U.S. PATENT DOCUMENTS 7,789,176 B2*  9/2010  Zhou .................. B60H 1/32281
                                                180/65.1
8,336,319 B2* 12/2012  Johnston ............... B60L 3/0046
                                                    62/79
9,731,577 B2   8/2017  Johnston

FOREIGN PATENT DOCUMENTS

KR    20110133415 A    12/2011
KR    20120108078 A    10/2012
(Continued)

OTHER PUBLICATIONS

International Search Report issued in PCT/KR2019/005309 dated Aug. 20, 2019.

*Primary Examiner* — Davis D Hwu
(74) *Attorney, Agent, or Firm* — Norton Rose Fulbright US LLP; James R. Crawford

(57) ABSTRACT

The present invention relates to a thermal management system for a vehicle, which can provide various effects, such as a reduction of weight, a cost reduction, and a reduction of a package size due to a reduction in the number of components. The thermal management system for a vehicle, which includes a refrigerant circulation loop circulating refrigerant and exchanging heat between the refrigerant and inside air of an air-conditioning case in order to perform air-conditioning inside the vehicle, includes: a first coolant loop for cooling electric parts of the vehicle; and a second coolant loop for cooling a battery of the vehicle, wherein the first coolant loop and the second coolant loop are configured (Continued)

independently, and coolant flowing in the first coolant loop selectively circulates in the second coolant loop.

21 Claims, 15 Drawing Sheets

(52) U.S. Cl.
CPC .................... *B60H 1/00899* (2013.01); *B60H 2001/00307* (2013.01); *B60H 2001/00949* (2013.01); *B60Y 2200/91* (2013.01)

(58) Field of Classification Search
USPC ............................................................ 62/79
See application file for complete search history.

(56) References Cited

FOREIGN PATENT DOCUMENTS

| | | |
|---|---|---|
| KR | 20130003726 A | 1/2013 |
| KR | 101703604 B1 | 2/2017 |

\* cited by examiner

PRIOR ART

PRIOR ART

PRIOR ART

THERMAL MANAGEMENT SYSTEM FOR VEHICLE

CROSS REFERENCE TO RELATED APPLICATIONS

This patent application is a national phase under 35 U.S.C. § 371 of International Patent Application No. PCT/KR2019/005309 filed May 3, 2019, which claims the benefit of priority from Korean patent application No. 10-2018-0051542 filed May 4, 2018, each of which is hereby incorporated herein by reference in its entirety for all purposes.

FIELD OF THE INVENTION

The present invention relates to a thermal management system for a vehicle, and more particularly, to a thermal management system for a vehicle which can change a flow direction of refrigerant using one refrigerant cycle in order to selectively perform cooling and heating.

BACKGROUND INFORMATION

Background Art

In general, an air conditioner for a vehicle includes a cooling system for cooling the interior of the vehicle, and a heating system for heating the interior of the vehicle. The cooling system converts the air, which passes the outside of an evaporator, into cold air by exchanging heat between the air and refrigerant, which flows inside the evaporator, from the evaporator side to cool the interior of the vehicle. The heating system converts the air, which passes the outside of a heater core of a coolant cycle, into warm air by exchanging heat between the air and coolant, which flows inside the heater core, from the heater core side to heat the interior of the vehicle.

In the meantime, differently from the air conditioner for the vehicle, a heat pump system which is capable of selectively carrying out cooling and heating by changing a flow direction of refrigerant using one refrigerant cycle is disclosed. The heat pump system includes, for instance, two heat exchangers, namely, an indoor heat exchanger mounted inside an air-conditioning case to exchange heat with air blown to the interior of the vehicle and an outdoor heat exchanger mounted outside the air-conditioning case to exchange heat, and a direction-changing valve for changing a flow direction of refrigerant. Therefore, the indoor heat exchanger serves as a heat exchanger for cooling when the heat pump system is operated in a cooling mode according to the flow direction of refrigerant by the direction-changing valve and also serves as a heat exchanger for heating when the heat pump system is operated in a heating mode.

FIG. 1 is a schematic diagram of a conventional heat pump system for a vehicle, FIG. 2 is a view showing a cooling mode of the conventional heat pump system for a vehicle, and FIG. 3 is a view showing a heating mode of the conventional heat pump system for a vehicle.

As shown in FIG. 1, the conventional heat pump system for a vehicle includes a refrigerant circulation line 99, a coolant circulation line 98, a compressor 1, an indoor heat exchanger 2, an evaporator 5, an orifice 8, a water-refrigerant heat exchanger 19, and an expansion valve 15.

The evaporator 5 and the indoor heat exchanger 2 are mounted inside an air-conditioning case 7 in order, and a temperature-adjusting door 6 is disposed between the evaporator 5 and the indoor heat exchanger 2 in order to control a flow rate of cold air and warm air by selectively moving the air passing the evaporator 5 toward the indoor heat exchanger 2. A PTC heater 3 generating heat by electric energy may be disposed on one side of the indoor heat exchanger 2.

The compressor 1 is mounted in the refrigerant circulation line 99 to compress and discharge refrigerant, and the indoor heat exchanger 2 is mounted inside the air-conditioning case 7 to exchange heat between the air inside the air-conditioning case 7 and the refrigerant discharged from the compressor 1. In this instance, an accumulator 16 is mounted at an inlet of the compressor 1, which is the upstream side of the compressor 1. The accumulator 16 divides the refrigerant supplied to the compressor 1 into liquid-phase refrigerant and gas-phase refrigerant and supplies only the gas-phase refrigerant to the compressor 1. The evaporator 5 is mounted inside the air-conditioning case 7 in order to exchange heat between the inside air of the air-conditioning case 7 and the refrigerant supplied to the compressor 1.

The orifice 8 performs a throttling action, and is arranged at the downstream side of the indoor heat exchanger 2. The orifice 8 serves to function as a two-way valve and an orifice so as to be used as a valve for passing the refrigerant or as an expansion valve for throttling the refrigerant. The orifice 8 performs the throttling action of the refrigerant in a heating mode, but makes the refrigerant pass as it is in a cooling model.

The water-refrigerant heat exchanger 19 is arranged at the downstream side of the orifice 8 and may be a chiller for exchanging heat between the refrigerant and coolant. A three-way valve 13 is disposed at the upstream side of the water-refrigerant heat exchanger 19. The three-way valve 13 makes the refrigerant selectively flow toward the water-refrigerant heat exchanger 19 and the evaporator 5. The expansion valve 15 performs the throttle action and is disposed between the three-way valve 13 and the evaporator 5. The unexplained reference numeral 14 is a one-way valve.

The coolant circulation line 98 is a passage in which the coolant flows. The coolant flowing in the coolant circulation line exchanges heat with the refrigerant flowing in the refrigerant circulation line 99 through the water-refrigerant heat exchanger 19. The coolant circulation line passes electric parts 17, such as a vehicle motor, an inverter and others, and the coolant circulates the electric parts 17 so as to be heated by waste heat of the electric parts 17.

In the cooling mode, as shown in FIG. 2, the refrigerant discharged from the compressor 1 passes the indoor heat exchanger 2, passes the orifice 8 as it is, and then, passes the outdoor heat exchanger 12 after flowing toward the three-way valve 11. After that, the refrigerant passes the expansion valve 15 and the evaporator 5 by the three-way valve 13, and circulates the compressor 1 after passing the accumulator 16.

In the cooling mode, the temperature-adjusting door 6 closes the passage of the indoor heat exchanger 2, and the air inside the air-conditioning case 7 is cooled by the evaporator 5 and is discharged to the interior of the vehicle to perform cooling. In the cooling mode, the refrigerant is evaporated in the evaporator 5, and is condensed in the outdoor heat exchanger 12.

In the heating mode, as shown in FIG. 3, the refrigerant discharged from the compressor 1 is throttled while passing the orifice 8 after exchanging heat in the indoor heat exchanger 2, and then, passes the outdoor heat exchanger 12 by the three-way valve 11. After that, the refrigerant bypasses the evaporator 5 by the three-way valve 13, passes the water-refrigerant heat exchanger 19, passes the accumulator 16, and then, circulates the compressor 1. Moreover, the coolant flowing in the coolant circulation line 98 is heated by waste heat of the electric parts 17, and exchanges heat with the refrigerant flowing in the refrigerant circulation line 99 inside the water-refrigerant heat exchanger 19.

In the heating mode, the temperature-adjusting door 6 opens the passage of the indoor heat exchanger 2, and the air inside the air-conditioning case 7 is heated by the indoor heat exchanger 2 and is discharged to the interior of the vehicle in order to perform heating. In the heating mode, the refrigerant is condensed in the indoor heat exchanger 2, and is evaporated in the outdoor heat exchanger 12 and the water-refrigerant heat exchanger 19.

In the meantime, a heat pump system for a vehicle which uses a battery like an electric vehicle cools the waste heat of the electric parts and the battery using the water-refrigerant heat exchanger. Finally, the heat pump system recovers an air heat source through the outdoor unit, and waste heat of the electric parts and waste heat of the battery through the water-refrigerant heat exchanger when a heat pump is operated, in order to enhance performance of the heat pump.

The conventional heat pump system has various functions for thermal management of the vehicle. In order to show the various functions, the heat pump system requires a plurality of refrigerant valves and a plurality of expansion valves, but it has many problems, such as an increase of weight, a cost increase, and an increase of a package size due to an increase in the number of components.

Furthermore, the conventional heat pump system has a disadvantage in that it is difficult to apply to a system of a vehicle, which includes an internal combustion engine like a hybrid vehicle, due to the package problem. Additionally, the conventional heat pump system has a disadvantage in that it is difficult to additionally install an indoor heat exchanger inside the air-conditioning case since a heater core is installed in the vehicle having the internal combustion engine.

SUMMARY OF THE INVENTION

Accordingly, the present invention has been made to solve the above-mentioned problems occurring in the prior arts, and it is an object of the present invention to provide a thermal management system for a vehicle, which can provide various effects, such as a reduction of weight, a cost reduction, and a reduction of a package size due to a reduction in the number of components.

To accomplish the above object, according to the present invention, there is provided a thermal management system for a vehicle which includes a refrigerant circulation loop circulating refrigerant and exchanging heat between the refrigerant and inside air of an air-conditioning case in order to perform air-conditioning inside the vehicle, the thermal management system including: a first coolant loop for cooling electric parts of the vehicle; and a second coolant loop for cooling a battery of the vehicle, wherein the first coolant loop and the second coolant loop are configured independently, and coolant flowing in the first coolant loop selectively circulates in the second coolant loop.

Moreover, the first coolant loop includes an electric radiator for exchanging heat between the coolant and outdoor air, and the second coolant loop includes a chiller for exchanging heat between the coolant and refrigerant of the refrigerant circulation loop.

Furthermore, the electric radiator, the electric parts, the chiller and the battery are arranged in parallel and change and control a flow of the cooling water depending on operation modes.

Additionally, the electric parts are cooled by circulating the electric radiator of the first coolant loop or cooled by circulating the chiller of the second coolant loop, and the battery is cooled by circulating only the chiller of the second coolant loop.

In addition, the battery increases temperature using waste heat of the electric parts by circulating the electric parts of the first coolant loop.

Moreover, the second coolant loop includes a heater for heating the battery, and the battery increase temperature by circulating only the second coolant loop.

Furthermore, the thermal management system for a vehicle further includes a third coolant loop for connecting the first coolant loop and the second coolant loop with each other.

Additionally, the thermal management system for a vehicle further includes a first coolant valve disposed at the connected part between the first coolant loop and the third coolant loop in order to control an amount of the coolant flowing to the electric radiator and the chiller.

In addition, the thermal management system for a vehicle further includes a second coolant valve disposed at the connected part between the second coolant loop and the third coolant loop in order to control an amount of the coolant flowing to the chiller and the electric parts.

Moreover, the first coolant valve is a three-way valve arranged at the downstream side of the electric parts in a coolant flow direction.

Furthermore, the second coolant valve is disposed at the upstream side of the chiller in the coolant flow direction based on the second coolant loop, and a three-way valve is arranged at the downstream side of the chiller in the flow direction of the coolant flowing from the third coolant loop to the second coolant loop.

Additionally, the refrigerant circulation loop includes: a first refrigerant pipe in which a compressor, an outdoor heat exchanger, a first expansion valve and an evaporator are disposed in order; and a second refrigerant pipe branching off from the first refrigerant pipe, bypassing the evaporator, and passing the chiller which exchanges heat between the refrigerant and the coolant of the second coolant loop.

In addition, the thermal management system for a vehicle further includes a second expansion valve disposed at the upstream side of the chiller.

Moreover, the thermal management system for a vehicle further includes a heating heat exchanger disposed between the compressor and the outdoor heat exchanger to radiate heat in a heat pump mode.

Furthermore, the thermal management system for a vehicle further includes a third expansion valve disposed between the heating heat exchanger and the outdoor heat exchanger.

Additionally, the heating heat exchanger is an indoor heat exchanger disposed inside the air-conditioning case to exchange heat between the refrigerant and the air.

In addition, the thermal management system for a vehicle further includes a heating means disposed in the air-conditioning case, the heating means being a heater core for exchanging heat between cooling water of a cooling water line and the air, wherein the heating heat exchanger is a water-cooled condenser for exchanging heat between the refrigerant and the cooling water of the cooling water line.

Moreover, the cooling water line includes an engine line for selectively passing the engine of the vehicle, and a cooling water valve for controlling an amount of the refrigerant flowing to the engine and an amount of the refrigerant bypassing the engine.

Furthermore, the first refrigerant pipe includes an outdoor unit pipe passing the outdoor heat exchanger and an outdoor unit bypass pipe bypassing the outdoor heat exchanger, and a refrigerant valve for controlling an amount of the refrigerant flowing to the outdoor unit pipe and the outdoor unit bypass pipe.

Additionally, a coolant flow direction of the first coolant loop and a coolant flow direction of the second coolant loop are opposed to each other.

In addition, the coolant passing the battery bypasses the chiller and passes the electric parts, and the coolant passing the electric parts bypasses the electric radiator and is circulated to the battery.

Moreover, the coolant passing the battery of the second coolant loop flows to the electric parts of the first coolant loop through the third coolant loop, and the coolant passing the electric parts of the first coolant loop selectively flows to the chiller and the battery of the second coolant loop through the third coolant loop.

Furthermore, in a batter temperature-rising mode, the refrigerant passing the compressor and the outdoor heat exchanger bypasses the evaporator, passes the chiller through the second refrigerant pipe, and is circulated to the compressor. The coolant passing the battery passes the chiller and is circulated to the battery after exchanging heat with the refrigerant, or bypasses the chiller, passes the electric parts and is circulated to the battery after exchanging heat with the air.

The thermal management system for a vehicle according to an embodiment of the present invention can show various operation modes and greatly reduce the number of components. Therefore, the thermal management system for a vehicle according to the present invention can provide various effects, such as a reduction of weight, a cost reduction, and a reduction of a package size due to a reduction in the number of components by reducing the number of valves.

Moreover, the thermal management system for a vehicle according to an embodiment of the present invention integrates functions of a waste heat chiller and a battery chiller, includes a coolant line configured independently, and changes and controls a flow of coolant according to operation modes so as to perform cooling more effectively.

Furthermore, the thermal management system for a vehicle according to an embodiment of the present invention can perform heating by the heat pump under a condition that the engine is not operated and perform heating by engine heat under a condition that the engine is operated, and can share the air conditioner for the internal combustion engine without development of an air conditioner by using the heater core for the internal combustion engine as it is.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Hereinafter, a technical configuration of a thermal management system for a vehicle according to an embodiment of the present invention will be described in detail with reference to the accompanying drawings.

Figure 1:
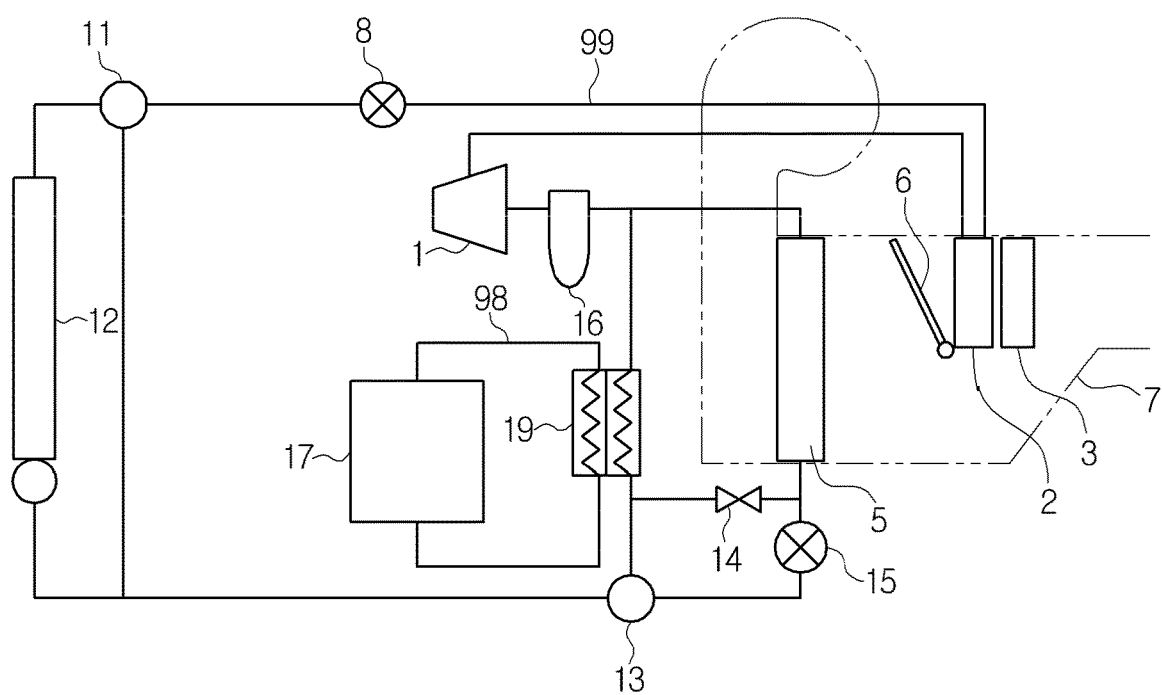
FIG. 1 is a schematic diagram of a conventional heat pump system for a vehicle.
Figure 2:
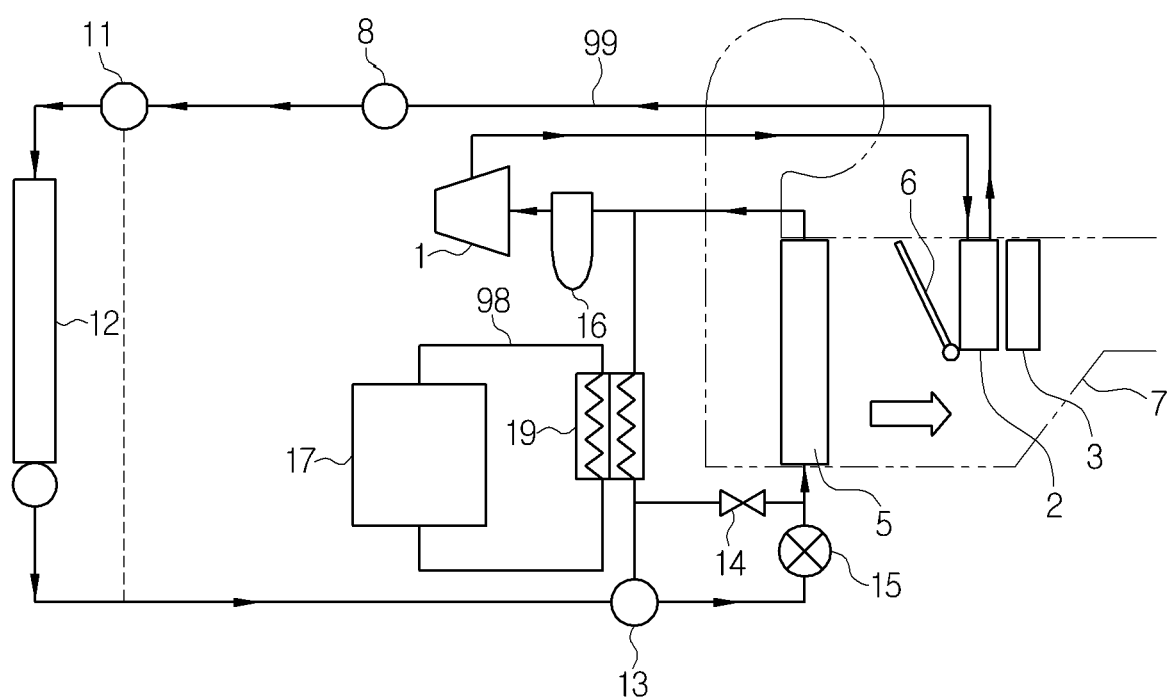
FIG. 2 is a view showing a cooling mode of the conventional heat pump system for a vehicle.
Figure 3:
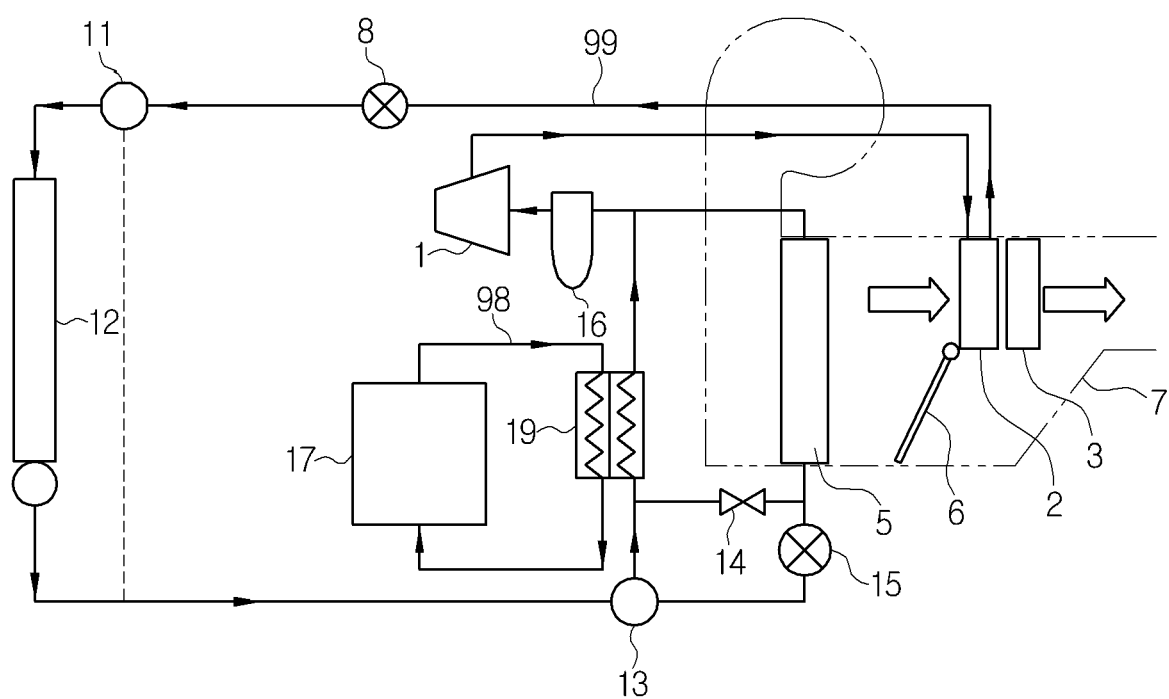
FIG. 3 is a view showing a heating mode of the conventional heat pump system for a vehicle.
Figure 4:
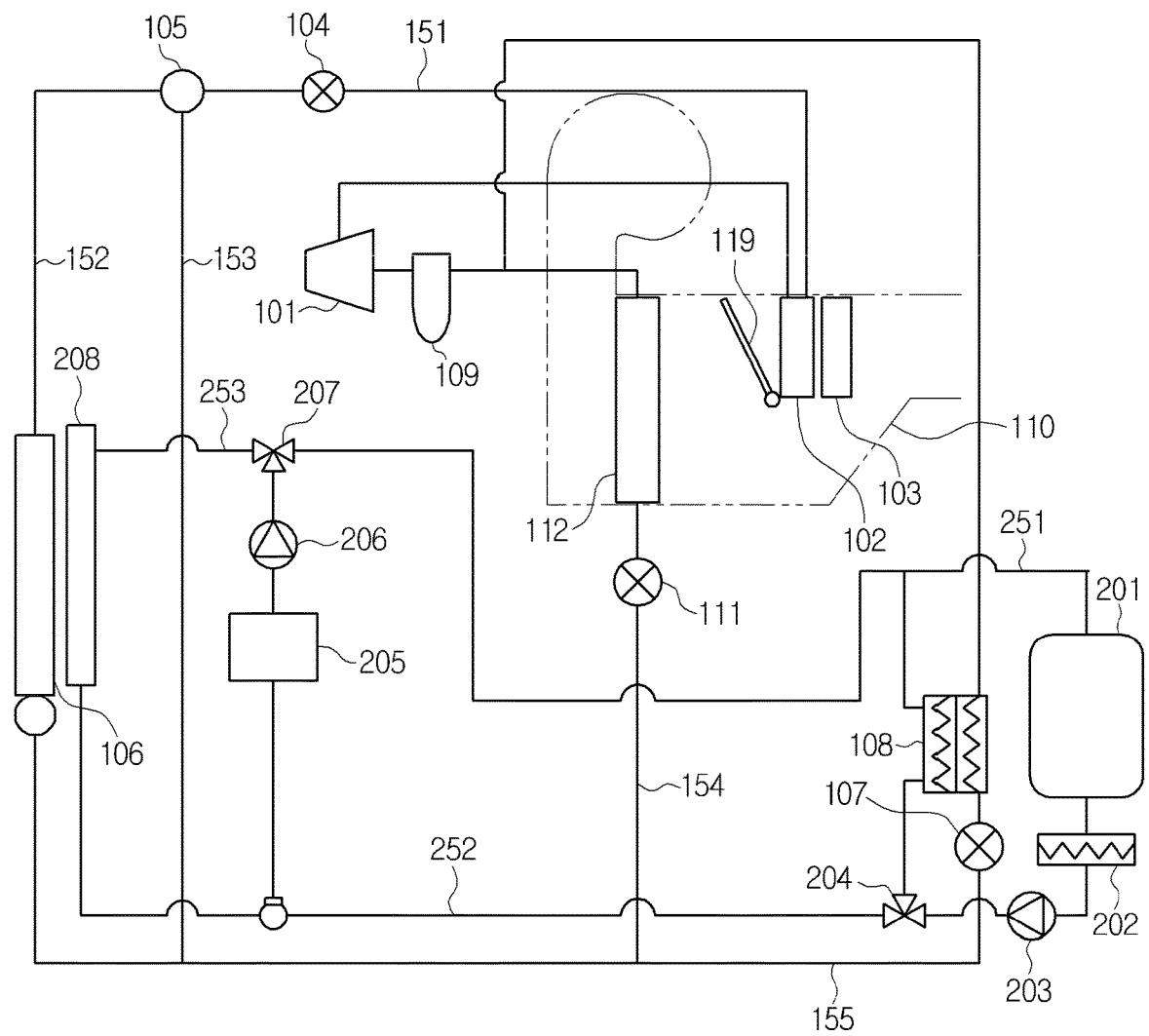
FIG. 4 is a schematic diagram of a thermal management system for a vehicle according to an embodiment of the present invention

FIG. 4 is a schematic diagram of a thermal management system for a vehicle according to an embodiment of the present invention.

Referring to FIG. 4, the thermal management system for a vehicle according to the embodiment of the present invention is applicable to plug-in hybrid vehicles or electric vehicles, and includes a refrigerant circulation loop, a first coolant loop 253, and a second coolant loop 251.

The refrigerant circulation loop circulates refrigerant and exchanges heat with the inside air of the air-conditioning case 110 in order to perform air-conditioning inside the vehicle. The refrigerant circulation loop includes a first refrigerant pipe 151 and a second refrigerant pipe 155. In the first refrigerant pipe 151, a compressor 101, an outdoor heat exchanger 106, a first expansion valve 111 and an evaporator 112 are disposed in order.

The compressor 101 inhales and compresses the refrigerant, and then, discharges the refrigerant in a gas state of high-temperature and high-pressure. An accumulator 109 for dividing the refrigerant introduced into the compressor 101 into liquid-phase refrigerant and gas-phase refrigerant and supplying only the gas-phase refrigerant is disposed at an inlet of the compressor 101.

The outdoor heat exchanger 106 is an air-cooled condenser for exchanging heat between refrigerant and air, and is disposed at the front of the vehicle to be aligned with an electric radiator 208. A blower may be separately disposed at the front or rear of the outdoor heat exchanger 106.

The first expansion valve 111 expands the refrigerant passing the outdoor heat exchanger 106 into refrigerant of low-temperature and low-pressure. The first expansion valve 111 may be an electronic expansion valve (EXV) having functions to throttle the refrigerant and adjust a flow rate of the refrigerant.

The evaporator 112 is disposed inside the air-conditioning case 110 and exchanges heat between the air and the refrigerant flowing inside the air-conditioning case 110 in order to cool the air. That is, the evaporator 112 is provided with the refrigerant of low-temperature and low-pressure by the throttling action of the first expansion valve 111 in a cooling mode, absorbs heat by exchanging heat with the air passing the evaporator 112 in order to cool the air. In a heating mode (heat pump mode), the first expansion valve 111 closes the flow of the refrigerant toward the evaporator 112 so that the evaporator 112 does not act as a means to cool the air. In the heating mode and a dehumidification mode, the refrigerant flows to the evaporator 112 to perform dehumidification of the air.

The second refrigerant pipe 155 branches off from the first refrigerant pipe 151 and bypasses the evaporator 112. The second refrigerant pipe 155 passes a chiller 108. The second refrigerant pipe 155 branches off between the downstream side of the outdoor heat exchanger 106 and the upstream side of the first expansion valve 111, bypasses the evaporator 112, and then, meets between the downstream side of the evaporator 112 and the upstream side of the accumulator 109. The refrigerant passing the outdoor heat exchanger 106 flows to the evaporator 112 through a pipe 154 of the evaporator or flows to the chiller 108 through the second refrigerant pipe 155.

The chiller 108 exchanges heat between the refrigerant and the coolant of the second coolant loop 251. Hereinafter, the coolant may be cooling water or other materials for cooling.

The second refrigerant pipe 155 includes a second expansion valve 107. The second expansion valve 107 is arranged upstream of the chiller 108 in a flow direction of the refrigerant. The second expansion valve 107 may be an electronic expansion valve (EXV) having functions to throttle the refrigerant and adjust a flow rate of the refrigerant.

The first refrigerant pipe 151 further includes a heating heat exchanger. The heating heat exchanger is disposed between the compressor 101 and the outdoor heat exchanger 106, and radiates heat in the heat pump mode. The heating heat exchanger exchanges heat between the refrigerant and other heat transfer medium passing the heating heat exchanger in order to radiate heat. In this instance, the heat transfer medium may be cooling water or air. In this embodiment, the heating heat exchanger is the indoor heat exchanger 102. The indoor heat exchanger 102 is disposed inside the air-conditioning case 110 and exchanges heat between the refrigerant and the air.

Inside the air-conditioning case 110, the evaporator 112 and the indoor heat exchanger 102 are arranged in the flow direction of the air in order. A heating means 103 for aiding heating is disposed at the downstream side of the indoor heat exchanger 102. The heating means 103 may be an electric PTC heater. A temp door 119 is disposed between the evaporator 112 and the indoor heat exchanger 102 in order to adjust discharge temperature by adjusting the degree of opening of a warm air passageway and a cold air passageway.

Moreover, the first refrigerant pipe 151 has a third expansion valve 104. The third expansion valve 104 is arranged between the indoor heat exchanger 102 and the outdoor heat exchanger 106. The third expansion valve 104 may be an electronic expansion valve (EXV) having functions to throttle the refrigerant and adjust a flow rate of the refrigerant.

The third expansion valve 104 does not perform the throttling action in the cooling mode but makes the refrigerant as it is, and throttles the refrigerant to expand the refrigerant into refrigerant of a low-temperature and low-pressure state in the heat pump mode (heating mode). In this instance, when the refrigerant bypasses the outdoor heat exchanger 106 even in the heat pump mode, the third expansion valve 104 does not perform the throttling action but the second expansion valve 107 throttles the refrigerant. This mode will be described later in detail referring to the drawings.

Furthermore, the first refrigerant pipe 151 includes an outdoor unit pipe 152 and an outdoor unit bypass pipe 153. The outdoor unit pipe 152 passes the outdoor heat exchanger 106, and the outdoor unit bypass pipe 153 bypasses the outdoor heat exchanger 106. A refrigerant valve 105 is disposed at a branching point between the outdoor unit pipe 152 and the outdoor unit bypass pipe 153. The refrigerant valve 105 is a three-way valve, and controls an amount of the refrigerant flowing in the outdoor unit pipe 152 and the outdoor unit bypass pipe 153.

Figure 12:
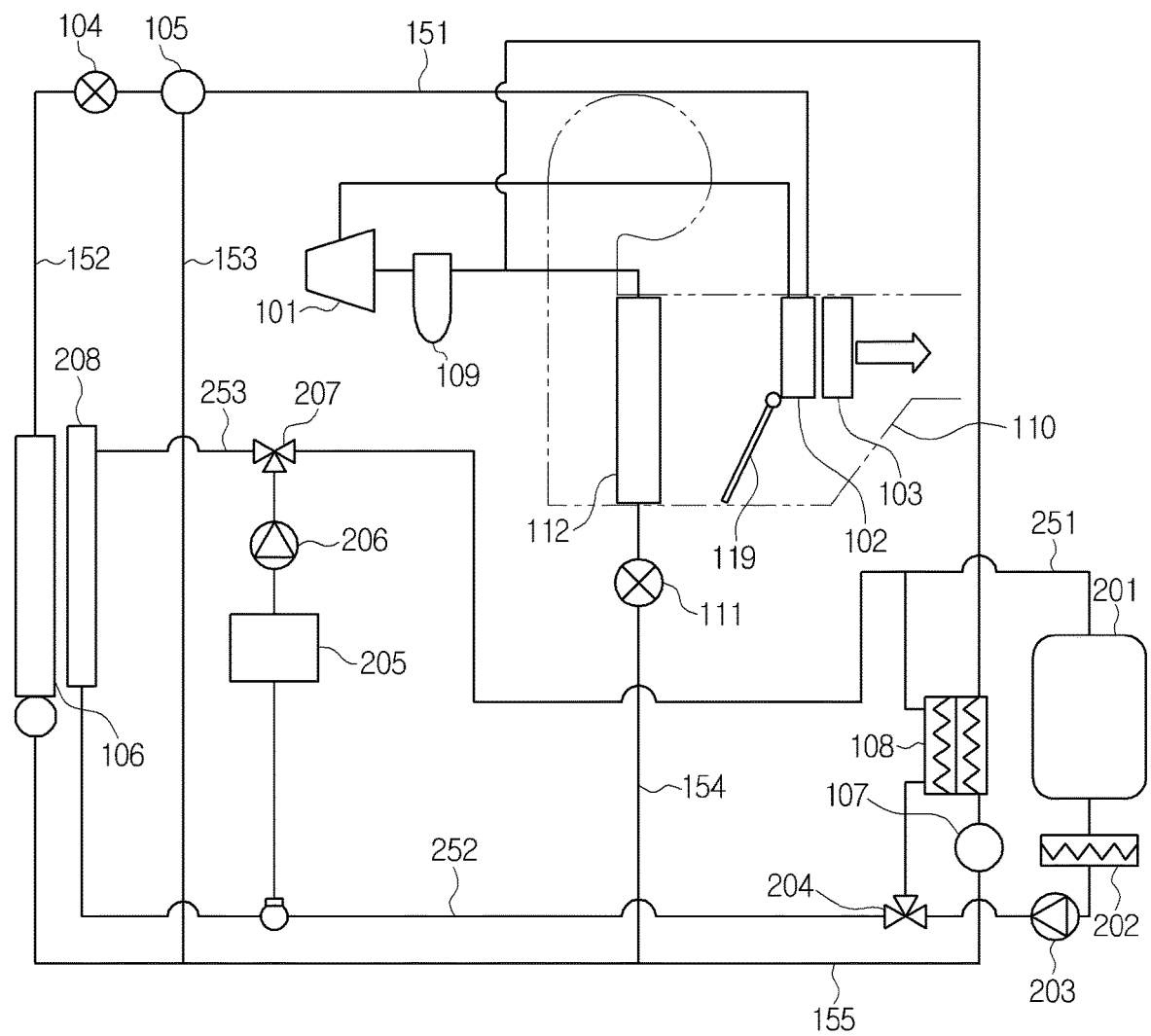
FIG. 12 is a schematic diagram of a thermal management system for a vehicle according to a modification of FIG. 4.

In this embodiment, the third expansion valve 104 is arranged at the upstream side of the refrigerant valve 105. FIG. 12 is a schematic diagram of a thermal management system for a vehicle according to a modification of FIG. 4. Referring to FIG. 12, the third expansion valve 104 may be arranged at the downstream side of the refrigerant valve 105.

The first coolant loop 253 is a pipe for cooling the electric parts 205 of the vehicle, and the coolant is cooling water. The first coolant loop 253 passes the electric radiator 208, the electric parts 205, and a first water pump 206 in order. The electric radiator 208 is disposed at the front of the vehicle, and exchanges heat between the coolant and outdoor air. The first water pump 206 circulates the cooling water of the first coolant loop 253.

The second coolant loop 251 is a pipe for cooling the battery 201 of the vehicle, and the coolant is cooling water. The second coolant loop 251 passes the chiller 108, the battery 201, a heater 202, and a second water pump 203 in order. The chiller 108 exchanges heat between the cooling water and the refrigerant of the refrigerant circulation loop. The heater 202 heats the cooling water in order to heat the battery 201 when temperature of the battery 201 rises. The second water pump 203 circulates the cooling water of the second coolant loop 251.

The first coolant loop 253 and the second coolant loop 251 are formed independently, and the coolant flowing in the first coolant loop 253 selectively circulates the second coolant loop 251. The electric radiator 208, the electric parts 205, the chiller 108 and the battery 201 are arranged in parallel in order to change and control a flow of the cooling water.

The electric parts 205 are cooled while the coolant circulates the electric radiator 208 of the first coolant loop 253 or cooled while the coolant circulates the chiller 108 of the second coolant loop 251. Furthermore, the battery 201 is cooled while the coolant circulates only the chiller 108 of the second coolant loop 251. That is, the battery 201 is always cooled only through the chiller 108, but does not have the cooling mode performed through the electric radiator 208.

Additionally, a third coolant loop 252 for connecting the first coolant loop 253 and the second coolant loop 251 with each other is disposed. The third coolant loop 252 selectively communicates the cooling water of the first coolant loop 253 to the second coolant loop 251 or the cooling water of the second coolant loop 251 to the first coolant loop 253 depending on opening and closing of the valve.

In more detail, the third coolant loop 252 branches off between the downstream side of the electric parts 205 of the first coolant loop 253 and the upstream side of the electric radiator 208 and meets between the downstream side of the chiller 108 of the second coolant loop 251 and the upstream side of the battery 201. In addition, the third coolant loop 252 branches off between the downstream side of the battery 201 of the second coolant loop 251 and the upstream side of the chiller 108 and meets between the downstream side of the electric radiator 208 and the upstream side of the electric parts 205.

A first coolant valve 207 is disposed at the connected part between the first coolant loop 253 and the third coolant loop 252. The first coolant valve 207 is a three-way valve arranged at the downstream side of the electric parts 205 in a flow direction of the coolant in order to control an amount of the coolant flowing to the electric radiator 208 and the chiller 108. The first coolant valve 207 is arranged between the electric parts 205 and the electric radiator 208 in order to send the cooling water passing the electric parts 205 to the electric radiator 208 or send the cooling water toward the second coolant loop 251 through the third coolant loop 252.

A second coolant valve 204 is disposed at the connected part between the second coolant loop 251 and the third coolant loop 252. The second coolant valve 204 is a three-way valve to control an amount of the coolant flowing to the battery 201, the chiller 108 and the electric parts 205. The second coolant valve 204 is disposed at the upstream side of the chiller 108 in the flow direction of the coolant based on the second coolant loop 251. Moreover, the second coolant valve 204 is arranged at the downstream side of the chiller 108 in the flow direction of the coolant flowing from the third coolant loop 252 to the second coolant loop 251.

The second coolant valve 204 is arranged between the battery 201 and the chiller 108, and selectively sends the cooling water passing the batter 201 to the chiller 108 or sends the cooling water toward the first coolant loop 253 through the third coolant loop 252. Furthermore, the second coolant valve 204 selectively sends the cooling water, which flows toward the second coolant loop 251 through the first coolant valve 207, to the chiller 108 or the battery 201.

The coolant passing the battery 201 of the second coolant loop 251 flows to the electric parts 205 of the first coolant loop 253 through the third coolant loop 252. Additionally, the coolant passing the electric parts 205 of the first coolant loop 253 selectively flows to the chiller 108 and the second coolant loop 251 through the third coolant loop 252.

The coolant flow directions of the first coolant loop 253 and the second coolant loop 251 are opposed to each other. That is, the coolant circulating in the first coolant loop 253 circulates the electric radiator 208, the electric parts 205, the first water pump 206 and the first coolant valve 207. Moreover, the coolant circulating in the second coolant loop 251 circulates the battery 201, the heater 202, the second water pump 203, the second coolant valve 204, and the chiller 108. As described above, the flow direction of the coolant circulating in the first coolant loop 253 and the flow direction of the coolant circulating in the second coolant loop 251 are opposed to each other.

In the meantime, the battery 201 may be controlled to increase temperature using waste heat of the electric parts (205) by circulating the electric parts (205) of the first coolant loop (253). In this instance, the coolant of the second coolant loop 251 is controls to pass the electric parts 205 through the third coolant loop 252 by control of the second coolant valve 204. That is, the coolant passing the battery 201 bypasses the chiller 108 and passes the electric parts 205, and the coolant passing the electric parts 205 bypasses the electric radiator 208 and circulates to the battery 201.

Through the above structure, the thermal management system for a vehicle according to the present invention can increase temperature of the battery 201 using waste heat of the electric parts 205 without operation of an additional heater so as to enhance energy efficiency. This mode will be described later in more detail referring to the drawings.

Furthermore, the battery 201 may be controlled to increase temperature by circulating only the second coolant loop 251. In this instance, the coolant of the second coolant loop 251 circulates the chiller 108 without passing the electric parts 205 by the control of the second coolant valve 204 so as to circulate only in the second coolant loop 251.

Through the above structure, because the coolant is heated by the heater 202 while circulating only in the second coolant loop 251, it can minimize energy loss. This mode will be described later in more detail referring to the drawings.

To sum up, in the battery temperature-rising mode, the refrigerant passing the compressor 101 and the outdoor heat exchanger 106 bypasses the evaporator 112, passes the chiller 108 through the second refrigerant pipe 155, and then, is circulated to the compressor 101. Additionally, the coolant passing the battery 201 passes the chiller 108, exchanges heat with the refrigerant, and then, is circulated to the battery 201. Alternatively, the coolant bypasses the chiller 108, passes the electric parts 205, exchanges heat with the air, and then, is circulated to the battery 201.

Figure 5:
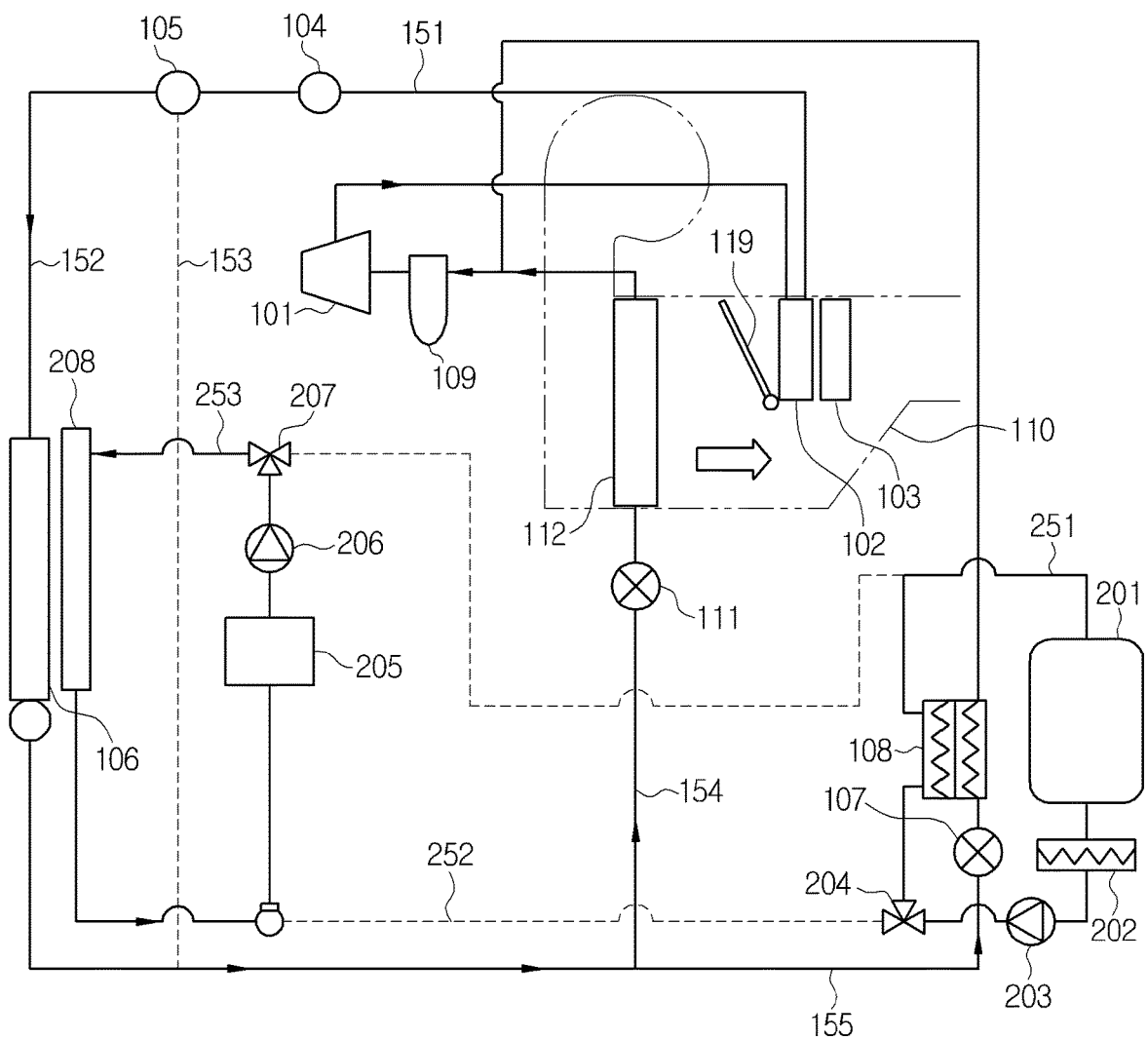
FIG. 5 is a view showing a cooling mode of the thermal management system for a vehicle according to the embodiment of the present invention.

FIG. 5 is a view showing the cooling mode of the thermal management system for a vehicle according to the embodiment of the present invention.

Referring to FIG. 5, in the cooling mode, the refrigerant discharged from the compressor 101 passes the third expansion valve 104 as it is and is condensed while passing the outdoor heat exchanger 106. Some of the refrigerant is throttled in the first expansion valve 111, exchanges heat with the air while passing the evaporator 112 in order to cool the air, and then, is returned to the compressor 101. The remainder of the refrigerant is throttled in the second expansion valve 107, exchanges heat with the coolant while passing the chiller 108 to cool the coolant, and then, is returned to the compressor 101. Independently from the second coolant loop 251, the coolant in the first coolant loop 253 circulates the electric radiator 208 and the electric parts 205, and the electric parts 205 are cooled by outdoor air.

In the cooling mode, the refrigerant is expanded in the first expansion valve 111 to cool the interior of the vehicle. Moreover, if it is necessary to cool the battery 201, the refrigerant flows toward the chiller 108 using the second expansion valve 107 in order to cool the cooling water. Finally, in case of the cooling water line, an electric parts cooling line and a battery chiller cooling line are operated independently. In this instance, battery cooling is always carried out only through the chiller, and when the battery is cooled, the electric radiator is not used.

Figure 6:
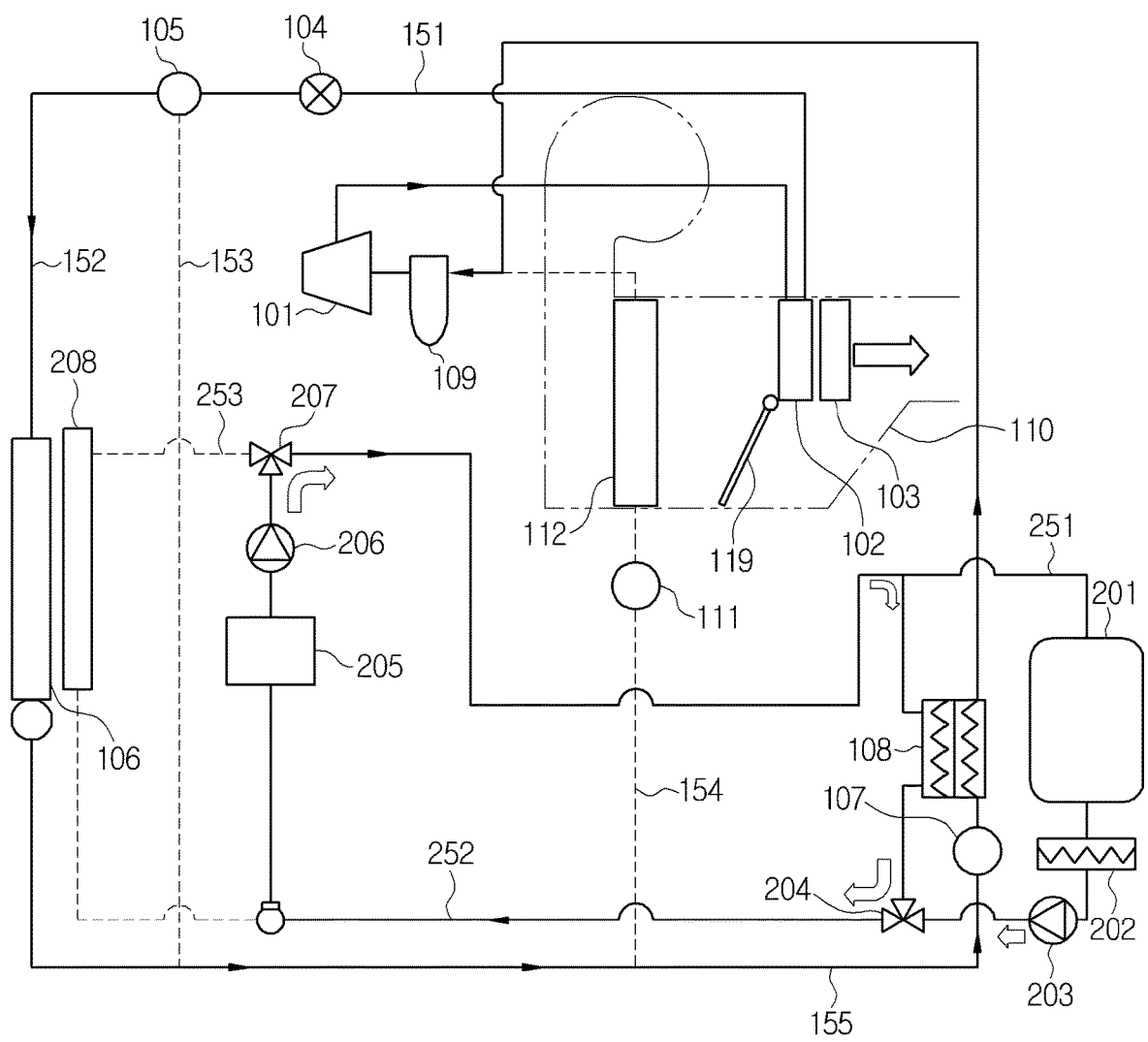
FIG. 6 is a view showing a heat pump mode of the thermal management system for a vehicle according to the embodiment of the present invention.

FIG. 6 is a view showing a heat pump mode of the thermal management system for a vehicle according to the embodiment of the present invention.

Referring to FIG. 6, in the heat pump mode (heating mode), the refrigerant discharged from the compressor 101 exchanges heat with the air and is condensed while passing the indoor heat exchanger 102, is expanded in the third expansion valve 104, passes the outdoor heat exchanger 106, bypasses the evaporator 112, and then, passes the chiller 108. The refrigerant passing the chiller 108 exchanges heat with the cooling water to absorb heat. In this instance, the second expansion valve 107 does not perform the throttling action, and makes the refrigerant flow as it is. The refrigerant heat-exchanged in the chiller 108 is returned to the compressor 101 and circulates the loop.

Additionally, the cooling water passing the electric parts 205 does not flow toward the electric radiator 208, some of the cooling water passes the chiller 108 through the third coolant loop 252, and the remainder of the cooling water passes the battery 201 and circulates the electric parts 205. In the heat pump mode, the thermal management system for a vehicle according to the present invention radiates heat energy of the refrigerant through the indoor heat exchanger in order to heat the interior of the vehicle. In addition, the refrigerant recovers an air heat source through the outdoor heat exchanger 106, and a water heat source through waste heat of the electric parts 205 and waste heat of the battery 201.

That is, the refrigerant in the third expansion valve 104 is expanded, recovers the air heat source in the outdoor heat exchanger 106, and recovers the water heat source in the chiller 108. If it is impossible to recover waste heat from the battery 201, it is possible to control the second coolant valve 204 to block the cooling water flowing toward the battery 201. In this instance, the refrigerant recovers only the air heat source and waste heat of the electric parts.

Figure 7:
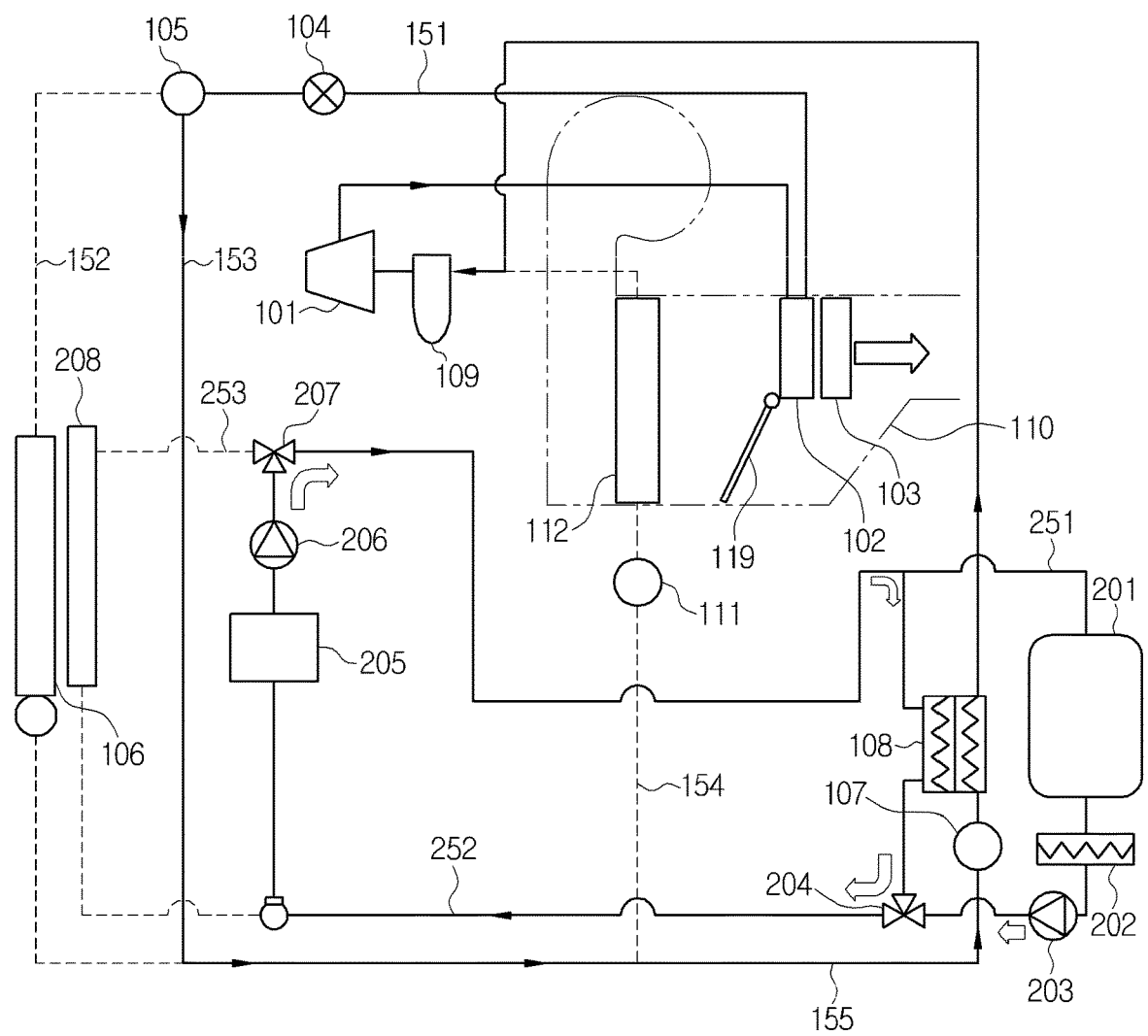
FIG. 7 is a view showing an outdoor unit bypass mode of the thermal management system for a vehicle according to the embodiment of the present invention.
Figure 8:
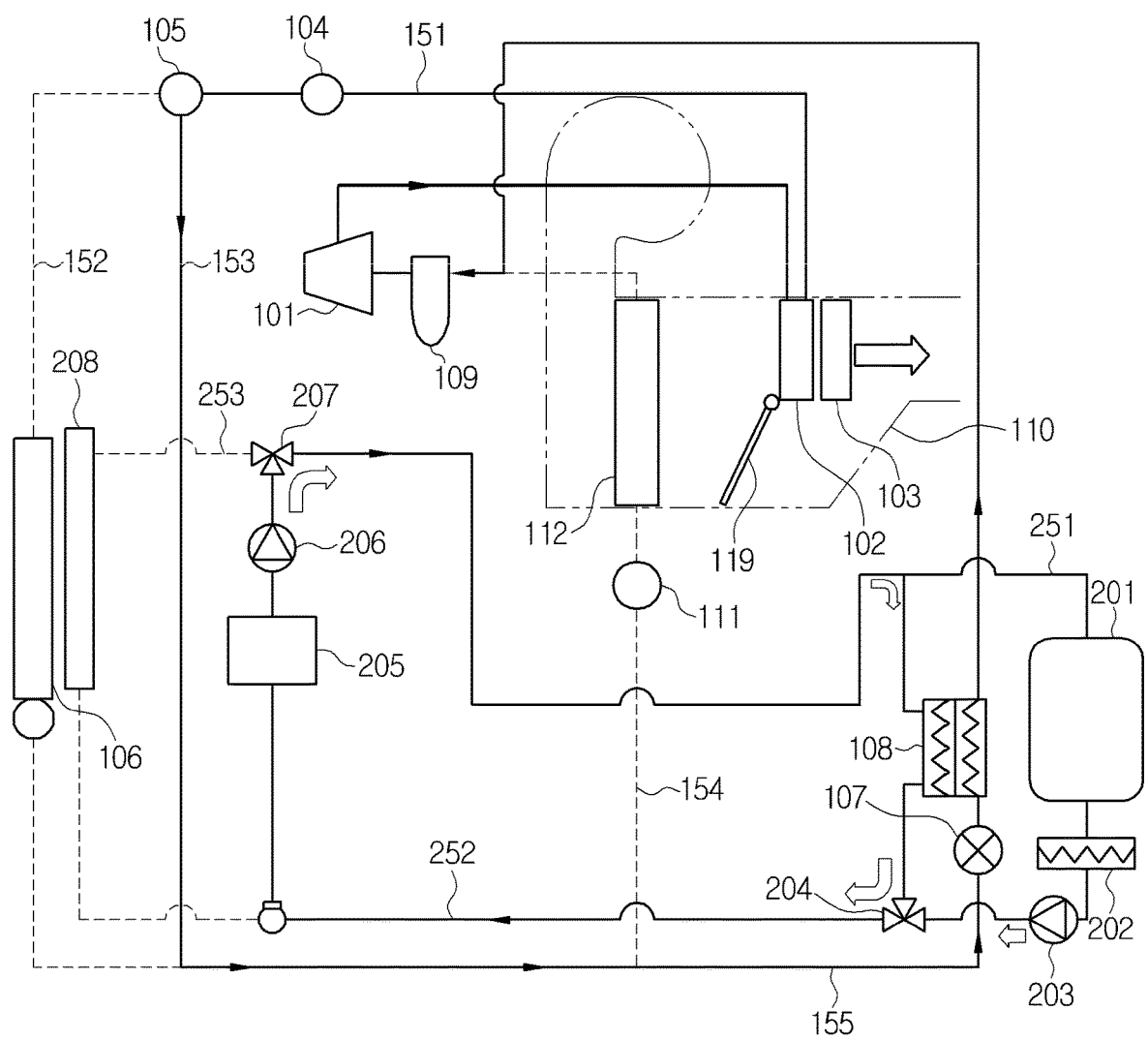
FIG. 8 is a view showing an outdoor unit bypass mode of the thermal management system for a vehicle according to the embodiment of the present invention.

FIGS. 7 and 8 are view showing an outdoor unit bypass mode of the thermal management system for a vehicle according to the embodiment of the present invention.

Referring to FIGS. 7 and 8, in the outdoor unit bypass mode, the refrigerant discharged from the compressor 101 exchanges heat and is condensed while passing the indoor heat exchanger 102. After that, the refrigerant bypasses the outdoor heat exchanger 106 through the refrigerant valve 105, bypasses the evaporator 112, flows to the chiller 108, and then, is returned to the compressor 101.

In this instance, as shown in FIG. 7, the refrigerant is expanded in the third expansion valve 104, flows to the second expansion valve 107 as it is, and passes the chiller 108. Alternatively, as shown in FIG. 8, the refrigerant passes the third expansion valve 104 as it is, is expanded in the second expansion valve 107, and passes the chiller 108. Furthermore, the flow of the cooling water flowing in the coolant loop is the same as FIG. 6.

As described above, before the heat pump mode, the thermal management system for a vehicle controls the first coolant valve 207 and the second coolant valve 204 in order to selectively use waste heat of the electric parts 205 or waste heat of the electric parts 205 and the battery 201.

Figure 9:
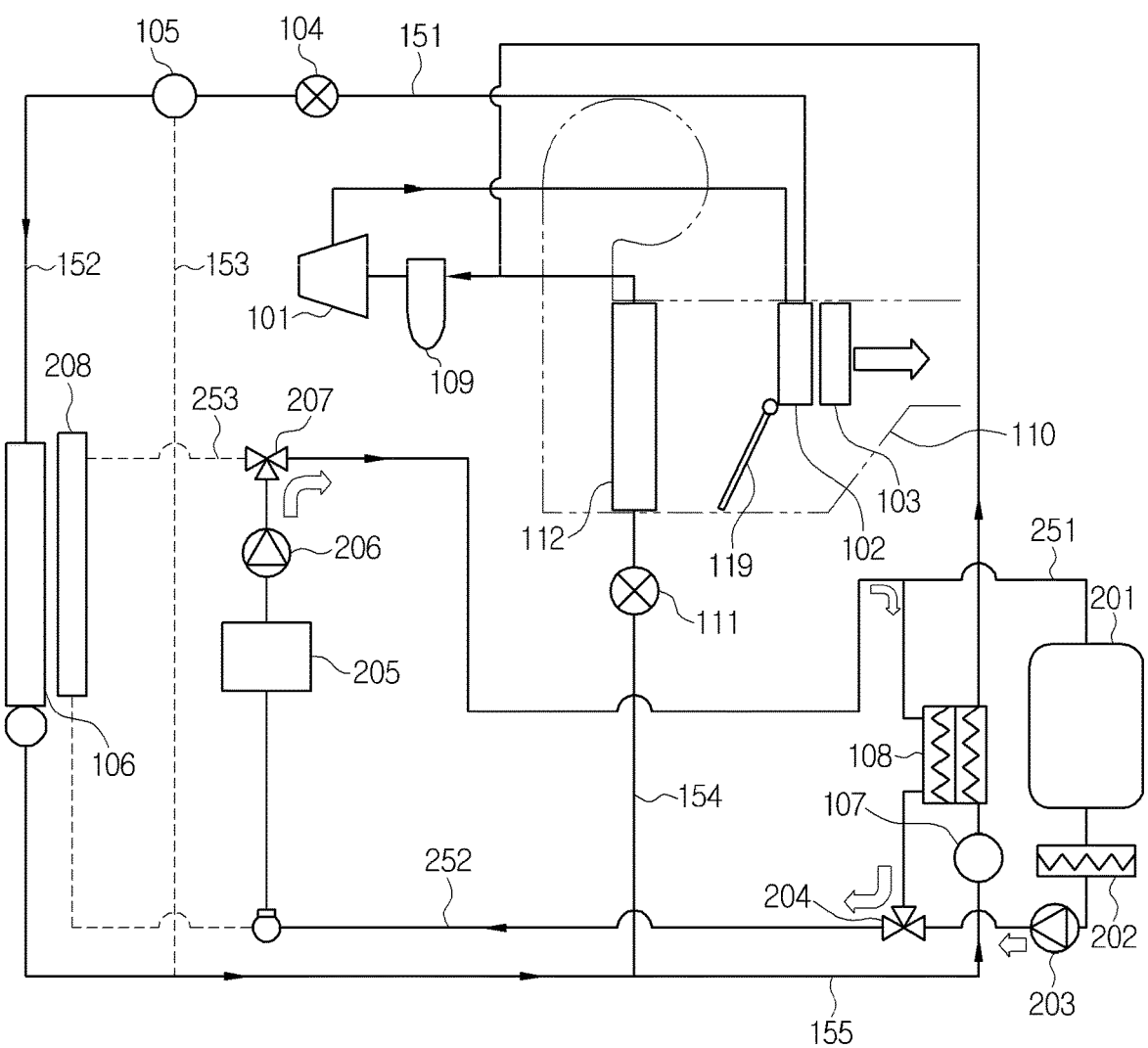
FIG. 9 is a view showing a heating and dehumidification mode of the thermal management system for a vehicle according to the embodiment of the present invention.

FIG. 9 is a view showing a heating and dehumidification mode of the thermal management system for a vehicle according to the embodiment of the present invention.

Referring to FIG. 9, in the heating and dehumidification mode, the refrigerant discharged from the compressor 101 exchanges heat with the air and is condensed while passing the indoor heat exchanger 102, is expanded in the third expansion valve 104, and passes the outdoor heat exchanger 106. Some of the refrigerant exchanges heat with the air while passing the evaporator 112, and is returned to the compressor 101, and the remainder of the refrigerant exchanges heat with the cooling water while passing the chiller 108, and is returned to the compressor 101. Furthermore, a flow of the cooling water flowing in the coolant loop is the same as FIG. 6. In this instance, even in the mode bypassing the outdoor heat exchanger 106, the thermal management system can show a dehumidifying effect using the first expansion valve 111.

Figure 10:
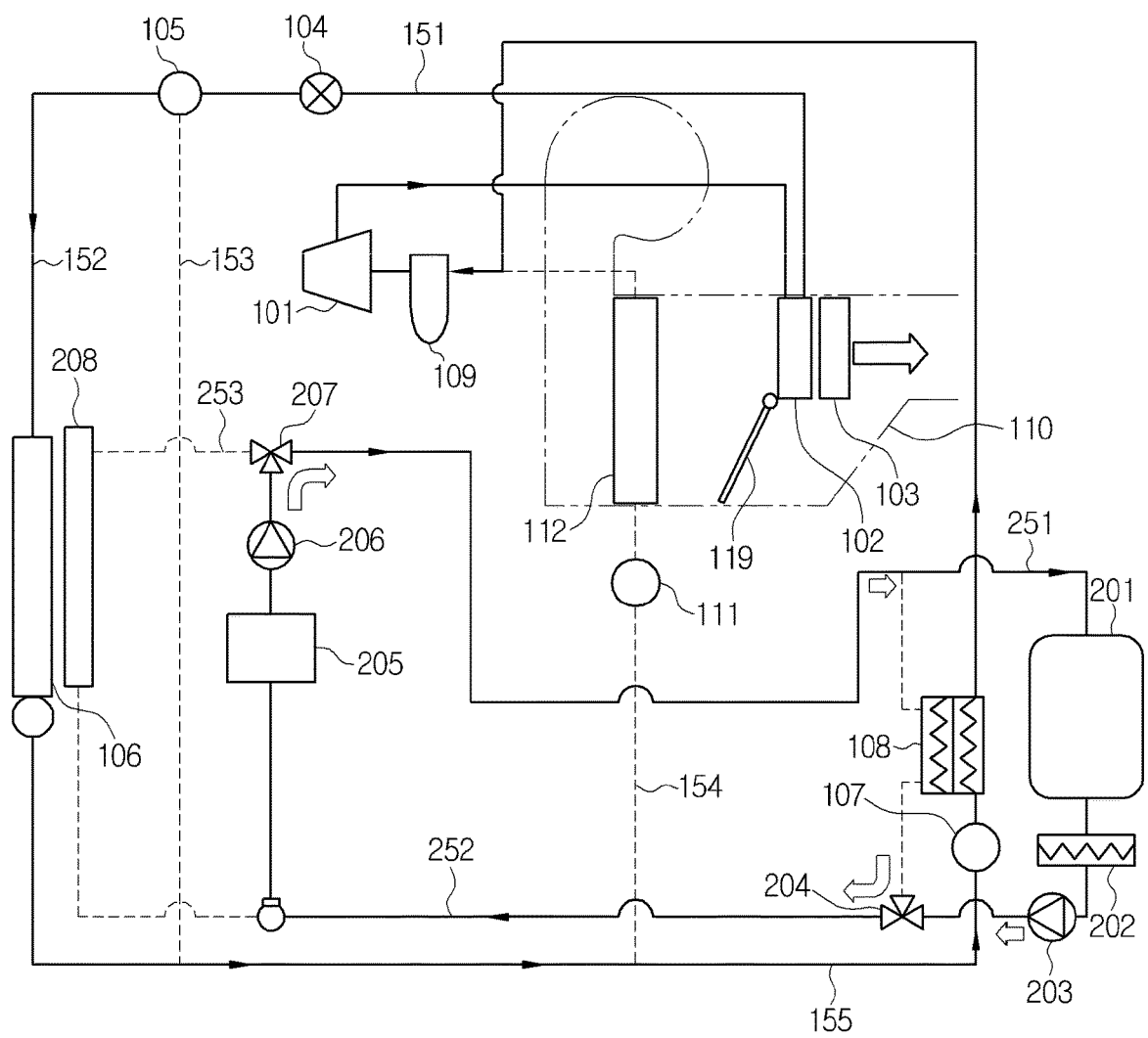
FIG. 10 is a view showing a battery temperature-rising mode of the thermal management system for a vehicle according to the embodiment of the present invention.
Figure 11:
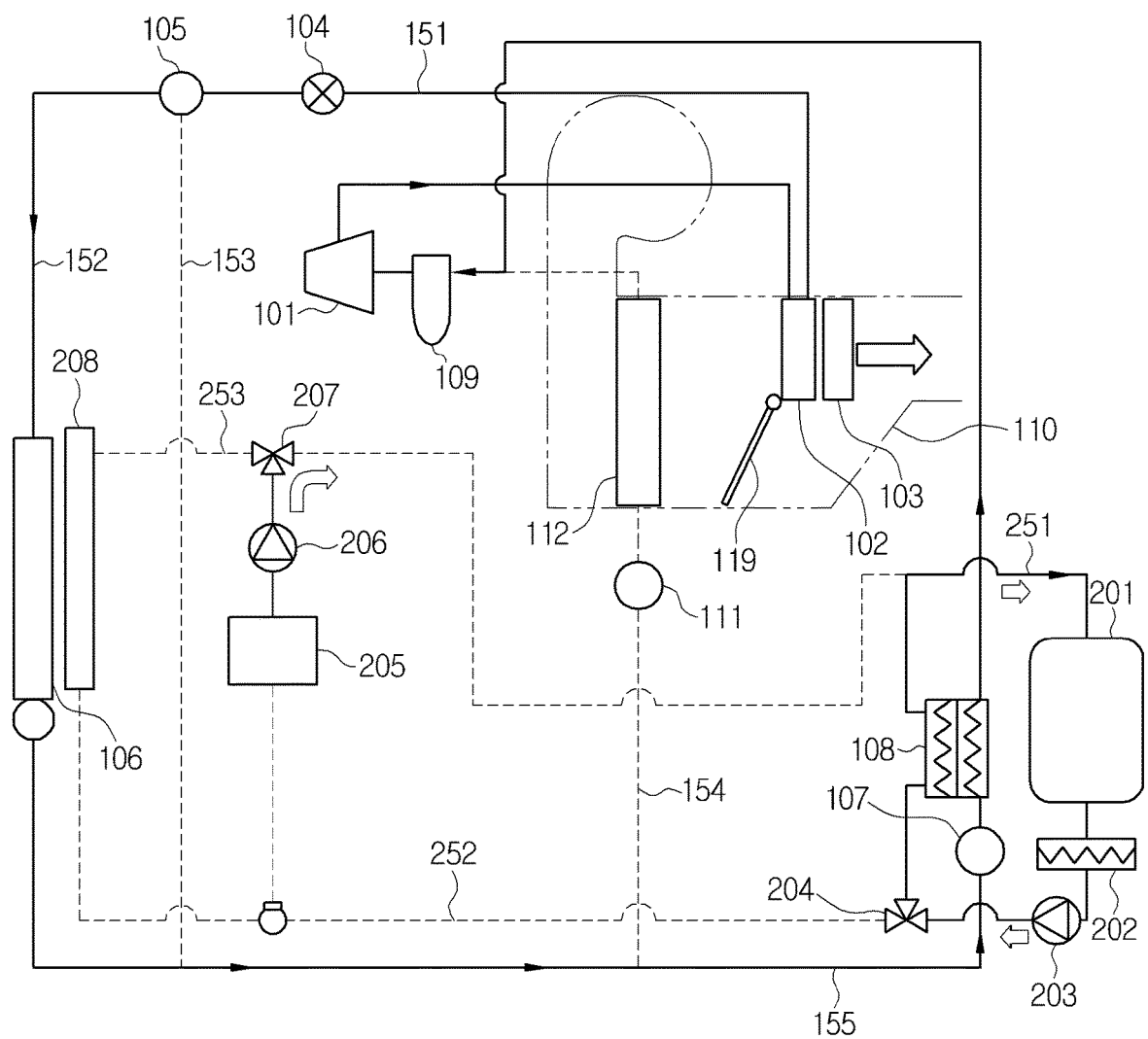
FIG. 11 is a view showing a battery temperature-rising mode of the thermal management system for a vehicle according to the embodiment of the present invention.

FIGS. 10 and 11 are views showing the battery temperature-rising mode of the thermal management system for a vehicle according to the embodiment of the present invention.

Referring to FIGS. 10 and 11, in the battery temperature-rising mode, the refrigerant discharged from the compressor 101 exchanges heat with the air and is condensed while passing the indoor heat exchanger 102, is expanded in the third expansion valve 104, passes the outdoor heat exchanger 106, bypasses the evaporator 112, and passes the chiller 108. The refrigerant passing the chiller 108 exchanges heat with the cooling water to absorb heat. The refrigerant heat-exchanged in the chiller 108 is returned to the compressor 101 to circulate the loop.

In this instance, the flow of the cooling water may be controlled by the entire cooling water line as shown in FIG. 10, and may be controlled by a partial cooling water line as shown in FIG. 11.

That is, as shown in FIG. 10, the cooling water passing the electric parts 205 does not flow toward the electric radiator 208 but flows to the battery 201 through the third coolant loop 252. In this instance, the cooling water does not flow to the chiller 108 but flows only to the battery 201, and then, is returned to the electric parts 205 to be circulated.

In the entire cooling water line mode, the battery 201 circulates the electric parts 205 of the first coolant loop 253 and increases temperature using waste heat of the electric parts 205. The cooling water of the second coolant loop 251 is controlled to pass the electric parts 205 through the third coolant loop 252 by the control of the second coolant valve 204.

Moreover, as shown in FIG. 11, the battery 201 201 circulates only the second coolant loop 251 to increase temperature. The cooling water of the second coolant loop 251 does not pass the electric parts 205 but circulates only the second coolant loop 251 after circulating the chiller 108 by the control of the second coolant valve 204.

The thermal management system for a vehicle according to the embodiment of the present invention can show various operation modes and remarkably reduce the number of components. Furthermore, the thermal management system for a vehicle according to the embodiment of the present invention integrates the function of the waste heat chiller of the electric parts and the function of battery chiller so as to serve as the battery chiller in the cooling mode and as the waste heat chiller of the electric parts in the heat pump mode. That is, the thermal management system for a vehicle according to the embodiment of the present invention can show various modes using one refrigerant valve and three expansion valves and show the cooling water loops corresponding to the various modes using two coolant valves.

The thermal management system for a vehicle according to the embodiment of the present invention can operate a cooling mode, a cooling and battery cooling mode, a heating mode using the air heat source and the water heat source, an outdoor unit bypass mode, a heating and dehumidification mode, an outdoor unit bypass and dehumidification mode, a battery temperature-rising mode, a heating and battery temperature-rising mode, and so on.

Additionally, the thermal management system for a vehicle according to the embodiment of the present invention can change the cooling water line according to each of the modes by arranging the electric radiator, the electric part module, the chiller and the battery. That is, the thermal management system for a vehicle according to the embodiment of the present invention can form an electric part module independent line and a battery cooling independent line using the electric radiator, and form the entire line including the independent line and the electric part module when temperature of the battery is increased. In addition, the thermal management system for a vehicle according to the embodiment of the present invention can form a line to recover only the waste heat of the electric parts and a line to recover waste heat of the electric parts and waste heat of the battery, and form a cooling water line to operate with the heat pump when temperature of the battery is increased. Moreover, the thermal management system for a vehicle according to the embodiment of the present invention can adjust the degree of opening of the first expansion valve to show the dehumidifying effect in the heating and dehumidification mode.

Figure 13:
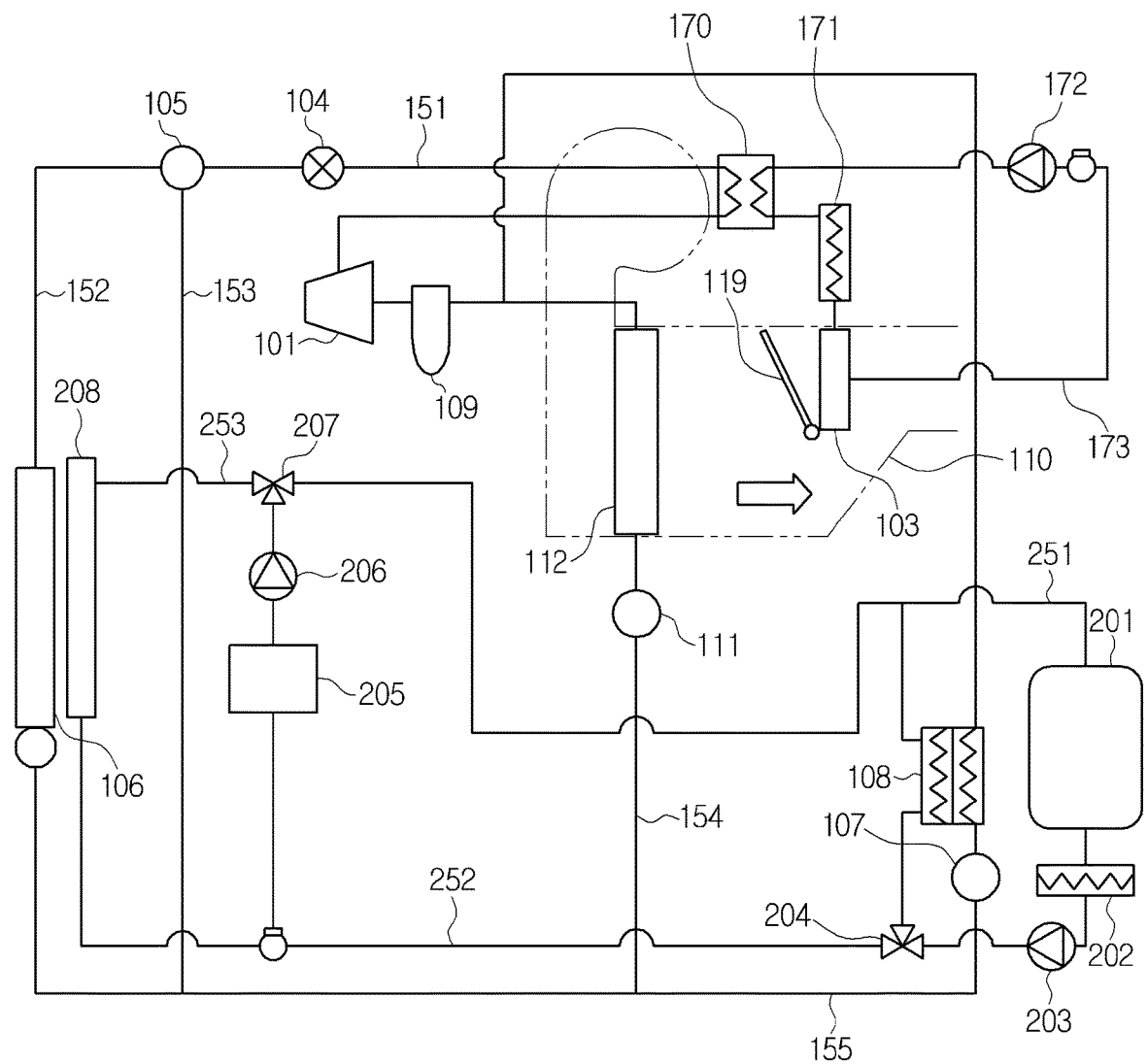
FIG. 13 is a schematic diagram of a thermal management system for a vehicle according to another modification of FIG. 4.

FIG. 13 is a schematic diagram of a thermal management system for a vehicle according to another modification of FIG. 4.

Referring to FIG. 13, the thermal management system for a vehicle according to the modification of the present invention has the same structure as the above-mentioned embodiment except changes of the heating heat exchanger and the heating means 103 and addition of a cooling water line 173.

That is, the heating heat exchanger is a water-cooled condenser 170. The water-cooled condenser 170 exchanges heat between the refrigerant and the cooling water line 173. The heating means 103 is a heater core. The heater core exchanges heat between the cooling water of the cooling water line 173 and the air in order to heat the interior of the vehicle. In the cooling water line 173, the water-cooled condenser 170, the heater 171, the heating means (heater core) 103, and the water pump 172 are disposed in order.

The thermal management system for a vehicle according to the modification of the present invention is applicable to electric vehicles, and transfers energy of the refrigerant toward the cooling water using a water-heated condenser. A heat transfer route is from the refrigerant to the cooling water, and from the cooling water to the air.

Figure 14:
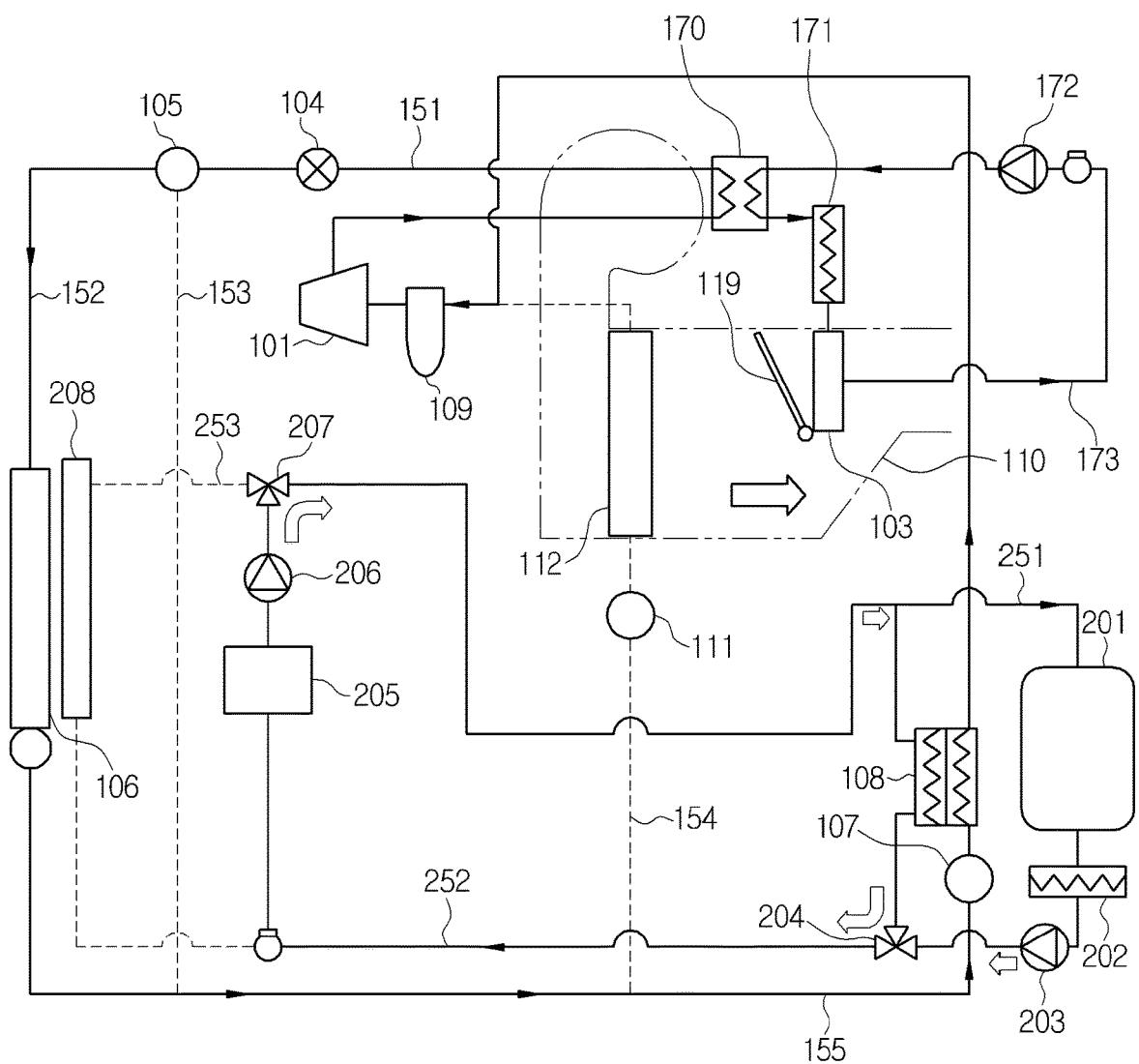
FIG. 14 is a view showing a heat pump mode of FIG. 13.

FIG. 14 is a view showing a heat pump mode of FIG. 13. Referring to FIG. 14, in the heat pump mode (heating mode), the refrigerant discharged from the compressor 101 exchanges heat with the cooling water of the cooling water line 173 and is condensed while passing the water-cooled condenser 170, is expanded in the third expansion valve 104, passes the outdoor heat exchanger 106, bypasses the evaporator 112, and then, passes the chiller 108. The refrigerant passing the chiller 108 exchanges heat with the cooling water of the coolant loop to absorb heat.

Figure 15:
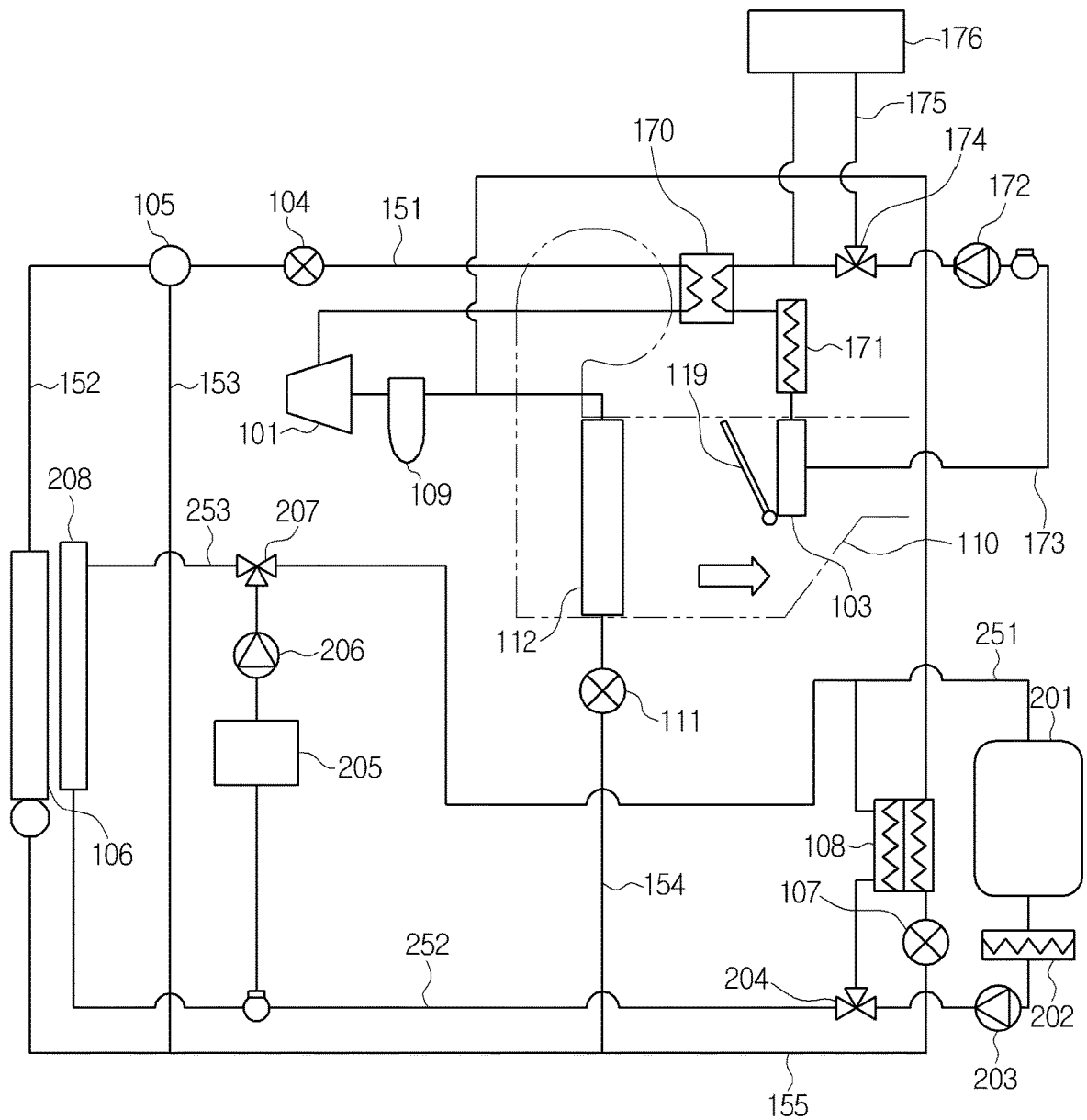
FIG. 15 is a schematic diagram of the thermal management system for a vehicle of FIG. 13.

FIG. 15 is a schematic diagram of the thermal management system for a vehicle of FIG. 13.

Referring to FIG. 15, the thermal management system for a vehicle according to the modification of the present invention is applicable to hybrid vehicles having internal combustion engines, and further includes an engine line 175 that the cooling water line 173 selectively passes the engine 176 of the vehicle. Moreover, a cooling water valve 174 is disposed to control an amount of the refrigerant flowing to the engine 176 and an amount of the refrigerant bypassing the engine 176.

That is, the cooling water line 173 may have a line that the refrigerant passes the engine 176 or bypasses the engine 176 using the cooling water valve 174. The line is formed to make the cooling water flow to the engine 176 when the engine is operated but to make the cooling water bypass the engine when the engine 176 is not operated.

As described above, the thermal management system for a vehicle according to the present invention is the heat pump system applicable not only to electric vehicles but also to hybrid vehicles by heating the interior of the vehicle using cooling water. Additionally, the thermal management system for a vehicle according to the present invention can share the air conditioner for the internal combustion engine without development of an air conditioner by using the heater core for the internal combustion engine as it is.

As described above, while the thermal management system for a vehicle according to the present invention has been particularly shown and described with reference to the example embodiments thereof, it will be understood by those of ordinary skill in the art that various changes, modifications and equivalents are possible from the present invention. Therefore, the actual technical protection scope of the present invention must be determined by the spirit of the appended claims.

What is claimed is:

1. A thermal management system for a vehicle which includes a refrigerant circulation loop circulating refrigerant and exchanging heat between the refrigerant and inside air of an air-conditioning case in order to perform air-conditioning inside the vehicle, the thermal management system comprising:
   a first coolant loop for cooling electric parts of the vehicle; and
   a second coolant loop for cooling a battery of the vehicle, wherein the first coolant loop and the second coolant loop are configured independently, and coolant flowing in the first coolant loop selectively circulates in the second coolant loop;
   a third coolant loop for connecting the first coolant loop and the second coolant loop with each other; and
   first coolant valve disposed at the connected part between the first coolant loop and the third coolant loop in order to control an amount of the coolant flowing to the electric radiator and the chiller;
   wherein the first coolant loop includes an electric radiator for exchanging heat between the coolant and outdoor air; and
   wherein the second coolant loop includes a chiller for exchanging heat between the coolant and refrigerant of the refrigerant circulation loop.

2. The thermal management system according to claim 1, wherein the electric radiator, the electric parts, the chiller and the battery are arranged in parallel and change and control a flow of the cooling water depending on operation modes.

3. The thermal management system according to claim 1, wherein the electric parts are cooled by circulating the electric radiator of the first coolant loop or cooled by circulating the chiller of the second coolant loop, and
   wherein the battery is cooled by circulating only the chiller of the second coolant loop.

4. The thermal management system according to claim 1, wherein the battery increases temperature using waste heat of the electric parts.

5. The thermal management system according to claim 1, wherein the second coolant loop includes a heater for heating the battery.

6. The thermal management system according to claim 1, further comprising:
a third coolant loop for connecting the first coolant loop and the second coolant loop with each other.

7. The thermal management system according to claim 1, further comprising:
a second coolant valve disposed at the connected part between the second coolant loop and the third coolant loop in order to control an amount of the coolant flowing to the chiller and the electric parts.

8. The thermal management system according to claim 1, wherein the first coolant valve is a three-way valve arranged at the downstream side of the electric parts in a coolant flow direction.

9. The thermal management system according to claim 7, wherein the second coolant valve is disposed at the upstream side of the chiller in the coolant flow direction based on the second coolant loop, and a three-way valve is arranged at the downstream side of the chiller in the flow direction of the coolant flowing from the third coolant loop to the second coolant loop.

10. A thermal management system for a vehicle which includes a refrigerant circulation loop circulating refrigerant and exchanging heat between the refrigerant and inside air of an air-conditioning case in order to perform air-conditioning inside the vehicle, the thermal management system comprising:
a first coolant loop for cooling electric parts of the vehicle; and
a second coolant loop for cooling a battery of the vehicle, wherein the first coolant loop and the second coolant loop are configured independently, and coolant flowing in the first coolant loop selectively circulates in the second coolant loop;
wherein the battery increases temperature using waste heat of the electric parts; and, wherein the refrigerant circulation loop comprises:
a first refrigerant pipe in which a compressor, an outdoor heat exchanger, a first expansion valve and an evaporator are disposed in order; and
a second refrigerant pipe branching off from the first refrigerant pipe, bypassing the evaporator, and passing the chiller which exchanges heat between the refrigerant and the coolant of the second coolant loop.

11. The thermal management system according to claim 10, further comprising:
a second expansion valve disposed at the upstream side of the chiller.

12. The thermal management system according to claim 10, further comprising:
a heating heat exchanger disposed between the compressor and the outdoor heat exchanger to radiate heat in a heat pump mode.

13. The thermal management system according to claim 12, further comprising:
a third expansion valve disposed between the heating heat exchanger and the outdoor heat exchanger.

14. The thermal management system according to claim 12, wherein the heating heat exchanger is an indoor heat exchanger disposed inside the air-conditioning case to exchange heat between the refrigerant and the air.

15. The thermal management system according to claim 12, further comprising:
a heating means disposed in the air-conditioning case, the heating means being a heater core for exchanging heat between cooling water of a cooling water line and the air,
wherein the heating heat exchanger is a water-cooled condenser for exchanging heat between the refrigerant and the cooling water of the cooling water line.

16. The thermal management system according to claim 15, wherein the cooling water line includes an engine line for selectively passing the engine of the vehicle, and a cooling water valve for controlling an amount of the refrigerant flowing to the engine and an amount of the refrigerant bypassing the engine.

17. The thermal management system according to claim 13, wherein the first refrigerant pipe includes an outdoor unit pipe passing the outdoor heat exchanger and an outdoor unit bypass pipe bypassing the outdoor heat exchanger, and a refrigerant valve for controlling an amount of the refrigerant flowing to the outdoor unit pipe and the outdoor unit bypass pipe.

18. The thermal management system according to claim 1, wherein a coolant flow direction of the first coolant loop and a coolant flow direction of the second coolant loop are opposed to each other.

19. A thermal management system for a vehicle which includes a refrigerant circulation loop circulating refrigerant and exchanging heat between the refrigerant and inside air of an air-conditioning case in order to perform air-conditioning inside the vehicle, the thermal management system comprising:
a first coolant loop for cooling electric parts of the vehicle; and
a second coolant loop for cooling a battery of the vehicle, wherein the first coolant loop and the second coolant loop are configured independently, and coolant flowing in the first coolant loop selectively circulates in the second coolant loop;
wherein the first coolant loop includes an electric radiator for exchanging heat between the coolant and outdoor air;
wherein the second coolant loop includes a chiller for exchanging heat between the coolant and refrigerant of the refrigerant circulation loop;
wherein the battery increases temperature using waste heat of the electric parts; and wherein the coolant passing the battery bypasses the chiller and passes the electric parts, and the coolant passing the electric parts bypasses the electric radiator and is circulated to the battery.

20. A thermal management system for a vehicle which includes a refrigerant circulation loop circulating refrigerant and exchanging heat between the refrigerant and inside air of an air-conditioning case in order to perform air-conditioning inside the vehicle, the thermal management system comprising:
a first coolant loop for cooling electric parts of the vehicle;
a second coolant loop for cooling a battery of the vehicle; and
a third coolant loop for connecting the first coolant loop and the second coolant loop with each other;
wherein the first coolant loop and the second coolant loop are configured independently, and coolant flowing in the first coolant loop selectively circulates in the second coolant loop; and
wherein the first coolant loop includes an electric radiator for exchanging heat between the coolant and outdoor air;
wherein the second coolant loop includes a chiller for exchanging heat between the coolant and refrigerant of the refrigerant circulation loop;

wherein the coolant passing the battery of the second coolant loop flows to the electric parts of the first coolant loop through the third coolant loop; and wherein the coolant passing the electric parts of the first coolant loop selectively flows to the chiller and the battery of the second coolant loop through the third coolant loop.

21. The thermal management system according to claim 10, wherein in a battery temperature-rising mode, the refrigerant passing the compressor and the outdoor heat exchanger bypasses the evaporator, passes the chiller through the second refrigerant pipe, and is circulated to the compressor, and wherein the coolant passing the battery passes the chiller and is circulated to the battery after exchanging heat with the refrigerant, or bypasses the chiller, passes the electric parts and is circulated to the battery after exchanging heat with the air.

* * * * *